(12) United States Patent  (10) Patent No.: US 8,407,004 B2
Ware  (45) Date of Patent: Mar. 26, 2013

(54) AIRFLOW DETECTOR AND METHOD OF MEASURING AIRFLOW

(75) Inventor: Gary Ware, Newton, MA (US)

(73) Assignee: Schneider Electric IT Corporation, West Kingston, RI (US)

(*) Notice: Subject to any disclaimer, the term of this patent is extended or adjusted under 35 U.S.C. 154(b) by 407 days.

(21) Appl. No.: 12/770,449

(22) Filed: Apr. 29, 2010

(65) Prior Publication Data

US 2011/0270539 A1 Nov. 3, 2011

(51) Int. Cl.
*G01W 1/00* (2006.01)
*F24F 7/00* (2006.01)
*A63B 53/00* (2006.01)

(52) U.S. Cl. .................. 702/3; 454/282; 73/170.01

(58) Field of Classification Search .............. 702/3, 33, 702/41–45, 81, 84, 127, 138–140, 182–183, 702/188–189; 73/1.16, 170.01, 170.05, 861.42, 73/861.66; 700/9, 28, 275–276, 282, 299–300; 454/184–185, 187, 228–234, 236, 241–242, 454/245, 254, 265–268, 275, 282, 339, 347, 454/358, 361–363
See application file for complete search history.

(56) References Cited

U.S. PATENT DOCUMENTS

| | | |
|---|---|---|
| 3,162,847 A | 12/1964 | Huffman |
| 3,791,089 A | 2/1974 | Alderman |
| 4,056,001 A | 11/1977 | Arakelian |
| 4,083,245 A | 4/1978 | Osborn |
| 4,317,374 A | 3/1982 | Casey |
| 4,561,309 A | 12/1985 | Rosner |
| 5,663,508 A | 9/1997 | Sparks |
| 6,199,337 B1 | 3/2001 | Colson et al. |
| 6,668,565 B1 | 12/2003 | Johnson et al. |
| 6,859,366 B2 | 2/2005 | Fink |
| 6,880,349 B2 | 4/2005 | Johnson et al. |
| 6,967,283 B2 | 11/2005 | Rasmussen et al. |

(Continued)

FOREIGN PATENT DOCUMENTS

| | | |
|---|---|---|
| DE | 1943021 A1 | 3/1970 |
| DE | 102009011007 A1 | 9/2010 |

(Continued)

OTHER PUBLICATIONS

International Search Report for PCT/US2011/034422 mailed Sep. 5, 2011.

(Continued)

*Primary Examiner* — Toan Le
(74) *Attorney, Agent, or Firm* — Lando & Anastasi, LLP

(57) ABSTRACT

An airflow detecting device includes a pivot rod, a first vane portion hingedly secured to the pivot rod and a second vane portion hingedly secured to the pivot rod. The airflow detecting device further includes a sensor assembly coupled to the first vane portion and the second vane portion. The sensor assembly generates a signal when the one of the first vane portion and the second vane portion is moved relative to the other of the second vane portion and the first vane portion when effected by airflow. The airflow detecting device further includes a control module secured to the pivot rod and coupled to the sensor assembly to receive the signal from the sensor assembly. The control module is configured to determine the direction and the amount of airflow based on the signal from the sensor assembly. Other embodiments of airflow detecting devices are further disclosed.

17 Claims, 8 Drawing Sheets

U.S. PATENT DOCUMENTS

| | | |
|---|---|---|
| 6,980,433 B2 | 12/2005 | Fink |
| 7,046,514 B2 | 5/2006 | Fink et al. |
| 7,096,147 B1 | 8/2006 | Low |
| 7,140,193 B2 | 11/2006 | Johnson et al. |
| 7,145,772 B2 | 12/2006 | Fink |
| 7,165,412 B1 | 1/2007 | Bean, Jr. |
| 7,173,820 B2 | 2/2007 | Fink et al. |
| 7,259,963 B2 | 8/2007 | Germagian et al. |
| 7,293,666 B2 | 11/2007 | Mattlin et al. |
| 7,325,410 B1 | 2/2008 | Bean, Jr. |
| 7,430,118 B1 | 9/2008 | Noteboom et al. |
| 7,520,181 B2 | 4/2009 | Ye et al. |
| 7,861,596 B2 | 1/2011 | Bean, Jr. |
| 8,104,707 B1 * | 1/2012 | Ohanian, III ............... 244/23 C |
| 2003/0050003 A1 | 3/2003 | Charron |
| 2005/0208888 A1 * | 9/2005 | Moore et al. .................. 454/334 |
| 2006/0248961 A1 | 11/2006 | Shachar et al. |
| 2007/0167125 A1 | 7/2007 | Rasmussen et al. |
| 2009/0277622 A1 | 11/2009 | Nair |
| 2010/0061057 A1 | 3/2010 | Dersch et al. |
| 2010/0186517 A1 | 7/2010 | Bean, Jr. |

FOREIGN PATENT DOCUMENTS

| | | |
|---|---|---|
| EP | 0033182 A2 | 8/1981 |
| FR | 2 652 904 A1 | 4/1991 |
| JP | 60-188854 A | 9/1985 |
| WO | 02/41777 A1 | 5/2002 |
| WO | 2010131594 A1 | 11/2010 |

OTHER PUBLICATIONS

American Power Conversion Corporation Brochure, "Hot Aisle Containment System (HACS)," 2008, pp. 1-68.

International Search Report for PCT/US2009/068913 mailed Mar. 19, 2010.

Invitation to Pay Additional Fees and Partial International Search Report for PCT/US2009/053759 mailed Nov. 16, 2009.

Niemann, John, "Hot Aisle vs. Cold Aisle Containment," White Paper #135, APC by Schneider Electric, 2008 American Power Conversion, WP135Rev 0, pp. 1-13.

International Search Report for PCT/US2011/063664 mailed Apr. 11, 2012.

* cited by examiner

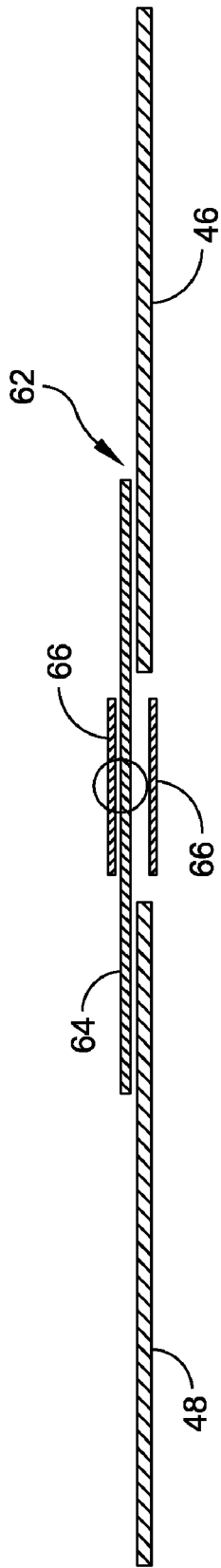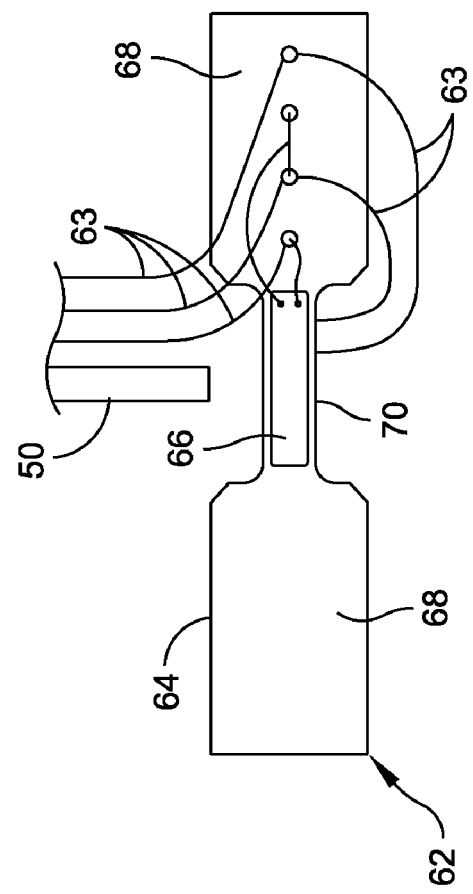

US 8,407,004 B2

AIRFLOW DETECTOR AND METHOD OF MEASURING AIRFLOW

BACKGROUND OF THE INVENTION

1. Field of the Disclosure

The present disclosure relates to airflow detecting systems, and more particularly to devices used to measure airflow within large spaces, as well as data rooms having racks and enclosures of the type used to house data processing, networking and telecommunications equipment.

BRIEF SUMMARY OF THE INVENTION

2. Discussion of Related Art

Equipment enclosures or racks for housing electronic equipment, such as data processing, networking and telecommunications equipment have been used for many years. Such racks are often used to contain and to arrange the equipment in large equipment rooms and data centers. In certain embodiments, an equipment storage rack can be an open configuration and can be housed within a rack enclosure, although the enclosure may be included when referring to a rack.

Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry-standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard.

Management systems have been developed to manage the power distribution and cooling systems of data centers containing racks. One such management system is known as the InfraStruXure™ ("ISX") manager offered by American Power Conversion Corporation of West Kingston, R.I., the assignee of the present disclosure, which is particularly designed to control the operation of large data centers.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by supplementing a data center's cooling system with computer room air conditioner ("CRAC") units. These CRAC units intake warmer air from the fronts of the units and output cooler air upwardly toward the ceiling of the data center room. In some embodiments, the CRAC units intake warmer air from near the ceiling of the data center room and discharge cooler air under a raised floor for delivery to the fronts of the equipment racks. In other embodiments, the CRAC units may be modular and scalable so that the units may be placed anywhere within the data center depending on the cooling requirements within the data center.

In certain configurations, the rack-mounted equipment typically cools itself by drawing air along a front side or air inlet side of a rack, drawing the air through its components, and subsequently exhausting the air from a rear or vent side of the rack. In one embodiment, air is drawn through the equipment racks from a "cold" aisle, which is typically located at the fronts of the equipment racks. The heated air is exhausted from the equipment racks to a "hot" or "warm" aisle, which is typically located at the backs of the equipment racks. Airflow requirements can vary considerably as a result of different numbers and types of rack-mounted components and different configurations of racks and enclosures. Measuring a velocity of airflow enables an operator to evaluate whether cooling demands of the data center are being met.

There are many known methods of measuring airflow velocity. Anemometers, for example, may be used but are not useful for indicating the direction of airflow. Also, anemometers are not very useful for measuring airflow less than 3 mph. Heated wires are also known within the equipment rack industry for measuring airflow. As with anemometers, heated wires are incapable of identifying the direction of airflow and are ineffective in measuring slow airflow. Other known methods suffer from the same shortfalls as anemometers and heated wires.

SUMMARY OF THE DISCLOSURE

One aspect of the present disclosure is directed to an airflow detecting device comprising at least one pivot rod, a first vane portion hingedly secured to the at least one pivot rod and a second vane portion hingedly secured to the at least one pivot rod. The arrangement is that the first vane portion is hingedly secured on one side of the at least one pivot rod and the second vane portion is hingedly secured to an opposite side of the at least one pivot rod so that the first vane portion and the second vane portion generally lie along a common plane. The airflow detecting device further comprises a first sensor assembly coupled to the first vane portion and the second vane portion. The first sensor assembly generates a signal when the one of the first vane portion and the second vane portion is moved relative to the other of the second vane portion and the first vane portion when effected by airflow. The airflow detecting device further comprises a control module secured to the at least one pivot rod and coupled to the first sensor assembly to receive the signal from the first sensor assembly. The control module is configured to determine the direction and the amount of airflow based on the signal from the first sensor assembly.

Embodiments of the airflow detecting device may include providing the first sensor assembly with a host strip secured to the first vane portion and the second vane portion and at least one strain gauge coupled to the host strip and the control module. The host strip has a body having enlarged end portions and a narrow middle portion. The at least one strain gauge is secured to the body at the narrow portion. In certain embodiments, the control module includes a microprocessor, a battery and a radio transceiver. The first vane portion and the second vane portion each includes a wire having a first end secured to the vane portion and a second end configured with an eyelet sized to receive the at least one pivot rod therein. The airflow detecting device may further comprise a third vane portion hingedly secured to the at least one pivot rod, a fourth vane portion hingedly secured to the at least one pivot rod, the arrangement being that the third vane portion is hingedly secured on one side of the at least one pivot rod and the fourth vane portion is hingedly secured to an opposite side of the at least one pivot rod so that the third vane portion and the fourth vane portion generally lie along a common plane that is generally perpendicular to the plane of the first vane portion and the second vane portion, and a second sensor assembly coupled to the third vane portion and the fourth vane portion. The second sensor assembly generates a signal when the one of the third vane portion and the fourth vane portion is moved relative to the other of the fourth vane portion and the third vane portion when effected by airflow. The third vane portion and the fourth vane portion each includes a wire having a first end secured to the vane portion and a second end configured with an eyelet sized to receive the at least one pivot rod therein. The airflow detecting device further comprises a fifth vane portion hingedly secured to the at least one pivot rod, a sixth vane portion hingedly secured to the at least one pivot rod, the arrangement being that the fifth vane portion is hingedly secured on one side of the at least one pivot rod and the sixth vane portion is hingedly secured to an opposite side of the at least one pivot rod so that the fifth vane portion and the sixth vane portion generally lie along a common plane that is generally perpendicular to the planes of the first and second vane portions and the third and fourth vane portions, and a third sensor assembly coupled to the fifth vane portion and the sixth vane portion. The third sensor assembly generates a signal when the one of the fifth vane portion and the sixth vane portion is moved relative to the other of the fifth vane portion and the sixth vane portion when effected by airflow. The fifth vane portion and the sixth vane portion each includes a wire having a first end secured to the vane portion and a second end configured with an eyelet sized to receive the at least one pivot rod therein. The first vane portion and the second vane portion are each fabricated from lightweight material including balsa wood.

Another aspect of the disclosure is directed to an airflow detecting device comprising a control module, a first vane assembly coupled to the control module and configured to detect airflow along an x-axis, a second vane assembly coupled to the control module and configured to detect airflow along a y-axis, and a third vane assembly coupled to the control module and configured to detect airflow along a z-axis. Each of the first, second and third vane assemblies include a sensor, coupled to the control module. Each sensor is configured to generate a signal when its respective vane assembly is deformed by airflow. The control module is configured to determine the direction and the amount of airflow based on signals generated by the sensors of the vane assemblies.

Embodiments of the airflow detecting device include providing each vane assembly with at least one pivot rod, a first vane portion hingedly secured to the at least one pivot rod, and a second vane portion hingedly secured to the at least one pivot rod. The arrangement is that the first vane portion is hingedly secured on one side of the at least one pivot rod and the second vane portion is hingedly secured to an opposite side of the at least one pivot rod so that the first vane portion and the second vane portion generally lie along a common plane. The first vane portion and the second vane portion each includes a wire having a first end secured to the vane portion and a second end configured with an eyelet sized to receive the at least one pivot rod therein. The at least one sensor includes a host strip secured to the first vane portion and the second vane portion and at least one strain gauge coupled to the host strip and the control module. The host strip has a body having enlarged end portions and a narrow middle portion. The at least one strain gauge is secured to the body at the narrow portion. The control module includes a microprocessor, a battery and a radio transceiver. The first vane portion and the second vane portion are each fabricated from lightweight material including balsa wood.

Yet another aspect of the disclosure is directed to an air containment system comprising a panel defining a boundary of an air containment zone, and an airflow detecting device coupled to the panel. In one embodiment, the airflow detecting device comprises a control module, a first vane assembly coupled to the control module and configured to detect airflow along an x-axis, a second vane assembly coupled to the control module and configured to detect airflow along a y-axis, and a third vane assembly coupled to the control module and configured to detect airflow along a z-axis. Each of the first, second and third vane assemblies include a sensor coupled to the control module. Each sensor is configured to generate a signal when its respective vane assembly is deformed by airflow. The control module is configured to determine the direction and the amount of airflow based on signals generated by the sensors of the vane assemblies.

Embodiments of the system further comprise means for controlling airflow into and out of the air containment zone. The means for controlling airflow comprises at least one cooling unit configured cool air within the air containment zone, the at least one cooling unit including a fan, and a controller coupled to the airflow detecting assembly and the at least one cooling unit. The controller is configured to manipulate the fan of the at least one cooling unit in response to the measured parameter. The first vane portion and the second vane portion of the airflow detecting device each includes a wire having a first end secured to the vane portion and a second end configured with an eyelet sized to receive at least one pivot rod of the airflow detecting device therein. The at least one sensor of the airflow detecting device includes a host strip secured to the first vane portion and the second vane portion and at least one strain gauge coupled to the host strip and the control module.

Another aspect of the disclosure is directed to a method of detecting airflow within a space. In a certain embodiment, the method comprises: placing a device within the space capable of detecting a direction of airflow from at least three directions and a speed of airflow down to 0.5 mph.

Embodiments of the method include providing a device comprising at least one pivot rod, a first vane portion hingedly secured to the at least one pivot rod, and a second vane portion hingedly secured to the at least one pivot rod. The arrangement is that the first vane portion is hingedly secured on one side of the at least one pivot rod and the second vane portion is hingedly secured to an opposite side of the at least one pivot rod so that the first vane portion and the second vane portion generally lie along a common plane. The device further comprises a first sensor assembly coupled to the first vane portion and the second vane portion. The first sensor assembly generates a signal when the one of the first vane portion and the second vane portion is moved relative to the other of the second vane portion and the first vane portion when effected by airflow. The device further comprises a control module secured to the at least one pivot rod and coupled to the first sensor assembly to receive the signal from the first sensor assembly. The control module is configured to determine the direction and the amount of airflow. In another embodiment, the device comprises a control module, a first vane assembly coupled to the control module and configured to detect airflow along an x-axis, a second vane assembly coupled to the control module and configured to detect airflow along a y-axis, and a third vane assembly coupled to the control module and configured to detect airflow along a z-axis. Each of the first, second and third vane assemblies include a sensor coupled to the control module. Each sensor is configured to generate a signal when its respective vane assembly is deformed by airflow. The control module is configured to determine the direction and the amount of airflow based on signals generated by the sensors of the vane assemblies.

The present disclosure will be more fully understood after a review of the following figures, detailed description and claims.

BRIEF DESCRIPTION OF THE DRAWINGS

In the drawings, each identical or nearly identical component that is illustrated in various figures is represented by a like numeral. For purposes of clarity, not every component may be labeled in every drawing. For a better understanding of the present disclosure, reference is made to the figures which are incorporated herein by reference and in which:

FIG. 4 is a schematic cross-sectional view of a sensor assembly and vanes of the airflow detecting device shown in FIGS. 2 and 3;

FIG. 5 is a top view of the sensor assembly shown in FIG. 4;

DETAILED DESCRIPTION OF THE INVENTION

Figure 1:
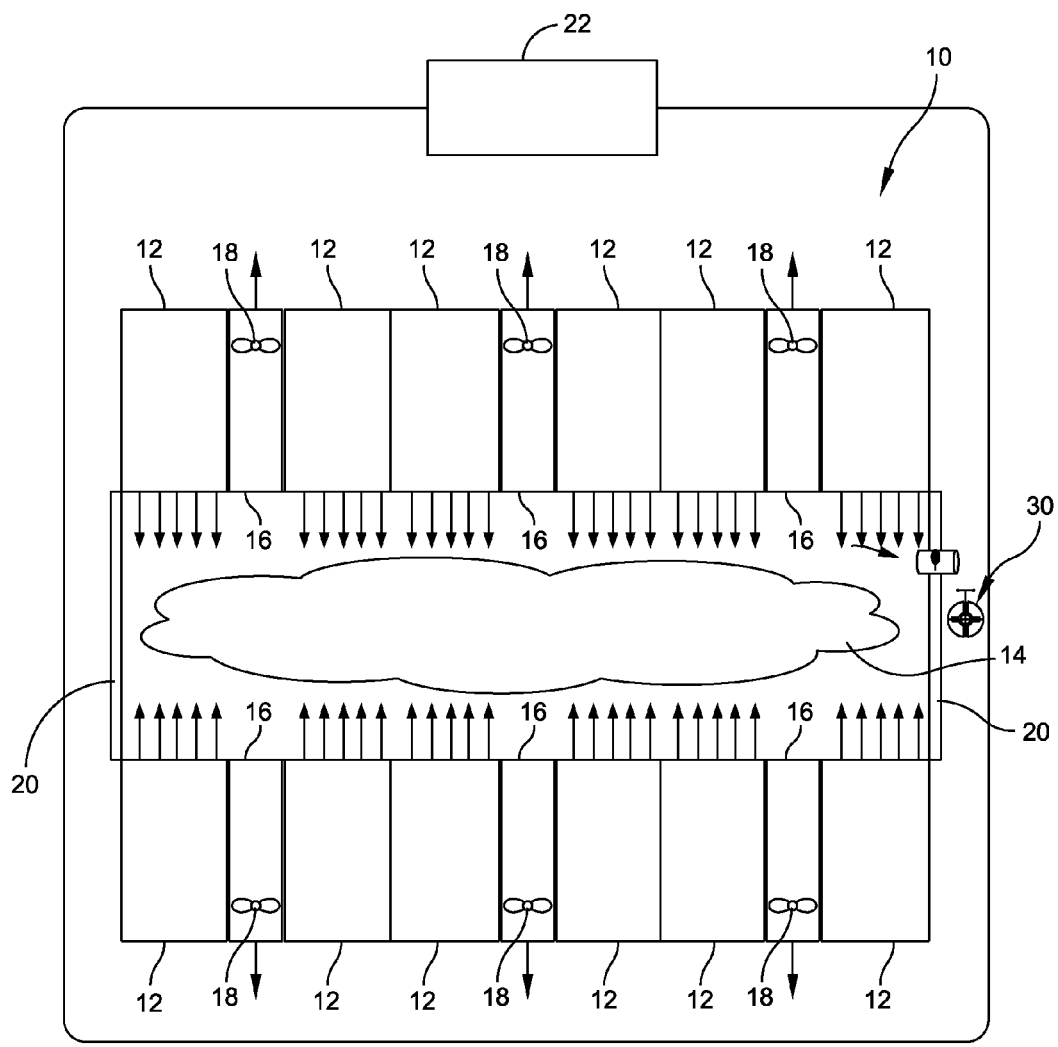
FIG. 1 is a schematic top plan view of a portion of a data center employing an airflow detecting device of an embodiment of the disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

A typical data center may be designed to house a number of equipment racks. In one embodiment, each equipment rack may be constructed in accordance with the teachings disclosed in U.S. Pat. No. 7,293,666, entitled EQUIPMENT ENCLOSURE KIT AND ASSEMBLY METHOD, which is owned by the assignee of the present disclosure and is incorporated herein by reference. Other examples of equipment racks are sold by American Power Conversion Corporation under the brand name NetShelter™. Further, cabling between the equipment racks may be implemented using cable distribution troughs contained on the roofs of the racks as disclosed in U.S. Pat. No. 6,967,283, which is also incorporated herein by reference and assigned to the assignee of the present disclosure. The principles of the present disclosure may be adapted to measure airflow in large spaces, such as auditoriums, lobbies and atriums. The data center described herein is provided by way of example only.

Each equipment rack may be configured to include a frame or housing adapted to support electronic components, such as data processing, networking and telecommunications equipment. The housing includes a front, a back, opposite sides, a bottom and a top. The front of each equipment rack may include a front door so as to enable access into the interior of the equipment rack. The sides of the equipment rack may include at least one panel to enclose the interior region of the rack. The back of the equipment rack may also include at least one panel or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack. In other embodiments, the front door may include a removable panel.

The equipment racks are modular in construction and configured to be rolled into and out of position, e.g., within a row of the data center. Once in position, electronic equipment may be positioned in the interior region of the equipment rack. For example, the equipment may be placed on shelving secured within the interior region of the equipment rack. In other embodiments, the electronic equipment may be employed within the equipment rack prior to positioning the equipment rack within the data center. Cables providing electrical and data communication may be provided through the top of the equipment rack either through a cover (or "roof") at the top of the equipment rack having openings formed therein or through an open top of the equipment rack. In this embodiment, the cables may be strung along the roofs of the racks or be provided in the aforementioned cable distribution troughs. In another embodiment, the cables may be disposed within a raised floor and connected to the electronic equipment through the bottom of the equipment rack. With both configurations, power and communication lines are provided to and from the equipment racks.

As discussed above, data centers may be configured with rows of equipment racks arranged such that cool air is drawn into the racks from a cool aisle and warm or hot air is exhausted from the racks into a hot aisle. In one embodiment, the equipment racks may be arranged in two rows with the fronts of the equipment racks in a near row being arranged in a forward direction and the backs of the equipment racks in a far row being arranged in a rearward direction. However, as stated above, there may be multiple rows of equipment racks wherein the rows may be arranged with the fronts of the equipment racks facing one another to define the cold aisle and with the backs of the equipment racks facing one another to define the hot aisle. In other configurations, the hot or cold aisle may be disposed between a wall and a row of equipment racks. For example, a row of equipment racks may be spaced from a wall with the backs of the equipment racks facing the wall to define a hot aisle between the wall and the row of equipment racks.

In order to address the heat build-up and hot spots within the data center or equipment room, and to address climate control issues within the data center or room in general, a cooling system may be provided. In one configuration, the cooling system may be provided as part of the data center infrastructure. In another configuration, the data center's cooling system may be supplemented with the traditional CRAC units described above. With yet another configuration, a modular cooling system may be provided.

In one embodiment, a management system may be provided to monitor and display conditions of the equipment racks and the cooling racks. The management system may operate independently to control the operation of specific equipment racks and cooling racks, and may be configured to communicate with a higher level network manager or with a management system associated with the equipment storage racks and/or cooling racks.

The controller may be adapted to control the operation of the cooling system based on environmental parameters obtained by the controller. In one embodiment, the controller may embody only controller units provided in the cooling racks that communicate with one another over a controller area network (CAN) Bus. In other embodiments, a master controller may be provided to control the operation of the controller units.

In certain circumstances, it may be desirable to control the air flow within the hot and cold aisles, and in the hot aisles in particular. Typically, heat generated from electronic components housed within the equipment racks is exhausted out of the backs of the equipment racks into the hot aisles. It may be further desirable to contain the hot air for conditioning by a cooling unit, such as the modular cooling unit described above. It is known to enclose the hot aisle with a ceiling assembly that is designed for the particular equipment rack configuration. Such known ceiling assemblies are typically installed when installing the equipment racks in the data center and are manufactured by the manufacturers of the equipment racks.

Referring now to the drawings, and more particularly to FIG. 1, there is generally indicated at 10 a portion of an exemplary data center. As shown, the data center 10 includes a plurality of equipment racks, each indicated at 12. The equipment racks 12 contain IT equipment, which may include data processing, networking and telecommunications equipment. The equipment racks 12 are configured in rows to define a hot aisle 14, which may be considered an air containment zone that is segregated from the rest of the data center. The arrangement is such that cool air enters the fronts of the equipment racks 12 and warm air is exhausted from the backs of the equipment racks.

The front of each equipment rack 12 may include one or more doors to enable access into the interior of the equipment rack. Although not shown, the front of the equipment rack 12 may include two doors. The sides of each equipment rack 12 may include one or more panels (not designated) to enclose the interior region of the equipment rack. The back of each equipment rack 12 may also include at least one panel (not shown) and/or a back door (not shown) to provide access to the interior of the equipment rack from the hot aisle 14. The side and back panels, as well as the front door and the back door, may be fabricated from perforated sheet metal, for example, to allow air to flow into and out of the interior region of the equipment rack.

One or more cooling units, each indicate at 16, may be disposed in between the equipment racks 14 to address heat build up contained within the hot aisle 14. The cooling units 16 may be configured to draw warm air from the hot aisle 14 through the backs of the cooling units, cool the warm air, and exhaust cool air from the fronts of the cooling units to the data center. To achieve the air flow from the hot aisle to the remainder of the data center, each cooling unit 16 may include one or more fans 18, which drive the movement of air through the respective cooling unit.

The equipment racks 12 and the cooling units 16 may be modular in construction and configured to be rolled into and out of position, e.g., within a row of the data center. Casters (not shown) may be secured to the bottom of each equipment rack 12 and cooling unit 16 to enable them to roll along the floor of the data center. Once positioned, leveling feet (not shown) may be deployed to securely ground the equipment racks 12 and the cooling units 16 in place within the row.

The hot aisle 14 may be defined by a ceiling or roof (not shown) and one or more walls or panels, each indicated at 20 in FIG. 1. A controller 22 is provided to control the operation of the equipment rack 12 or the cooling unit 16, or both. As discussed above, the controller 22 may be a dedicated unit to the cooling system of the data center 10 or part of an integrated data center control and monitoring system. In another embodiment, each cooling unit 16 may be independently operable by a dedicated controller provided in the cooling unit that is in communication with controllers of the other cooling units or with a network in communication with a master controller. Notwithstanding the particular configuration, the controller 22 is designed to control the independent operation of the cooling units 16 within the data center 10. Accordingly, the controller is illustrated schematically in FIG. 1 as being able to control all of the components used to measure and manipulate airflow within the air containment zone.

The controller 22 is configured to identify the failure or inability of a particular cooling unit 16 located within the data center 10 to cool the air, and to increase the cooling capacity of a cooling unit. Thus, the controller may control the air flow within the hot aisle 14 by manipulating the fans 18 of the cooling units. The controller 22 may be adapted to communicate with one another over a controller area network (CAN) Bus. Each cooling unit 16 may be provided with a display assembly (not shown) to display the environmental conditions of the data room, such as, and not limited to, the temperature and the humidity of the data center at the cooling unit, the temperature of the air entering into and exiting out of the cooling unit, the temperature of coolant entering into and exiting out of the cooling unit, the flow rate of coolant entering and/or exiting the cooling unit, the flow rate of air entering and/or exiting the cooling unit, and the cooling capacity of the cooling unit. The operation of the controller 22 is further discussed below with reference to FIGS. 9-11.

In embodiments of the disclosure, an air detecting device, generally indicated at 30, is strategically positioned within the data center 10 to measure the direction and magnitude of airflow within the hot aisle 14 of the data center. In certain embodiments, one or more airflow detecting devices 30 may be placed within the data center or within individual equipment racks. For example, the airflow detecting device 30 may be disposed within the backs of one or more equipment rack 12 and/or one or more cooling units 16, or in any suitable location within the data center 10 where there is a boundary between a hot aisle 14 and the remainder of the data center. As shown in FIG. 1, the airflow detecting device 30 is positioned adjacent panel 20 to measure airflow exiting the hot aisle 14 at a boundary of the hot aisle.

In other embodiments, the airflow detecting device 30 may be positioned at a desired location within a large space. For example, the airflow detecting device may be positioned within the upper regions of an auditorium or lobby to detect airflow. The information obtained by the airflow detecting devices 30 may be used to regulate cooling and airflow within the large space.

Figure 2:
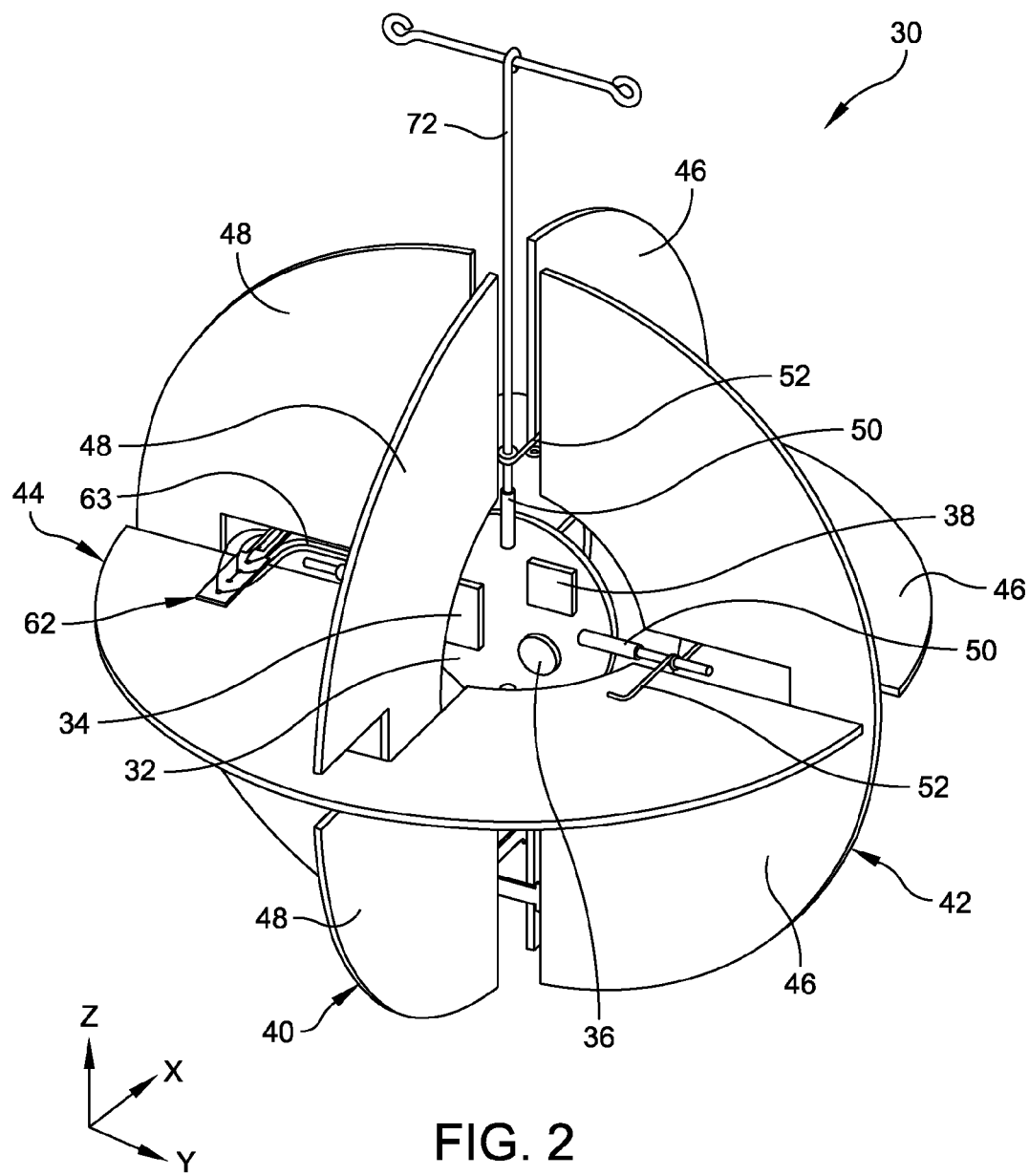
FIG. 2 is a perspective view of an airflow detecting device of an embodiment of the disclosure.
Figure 3:
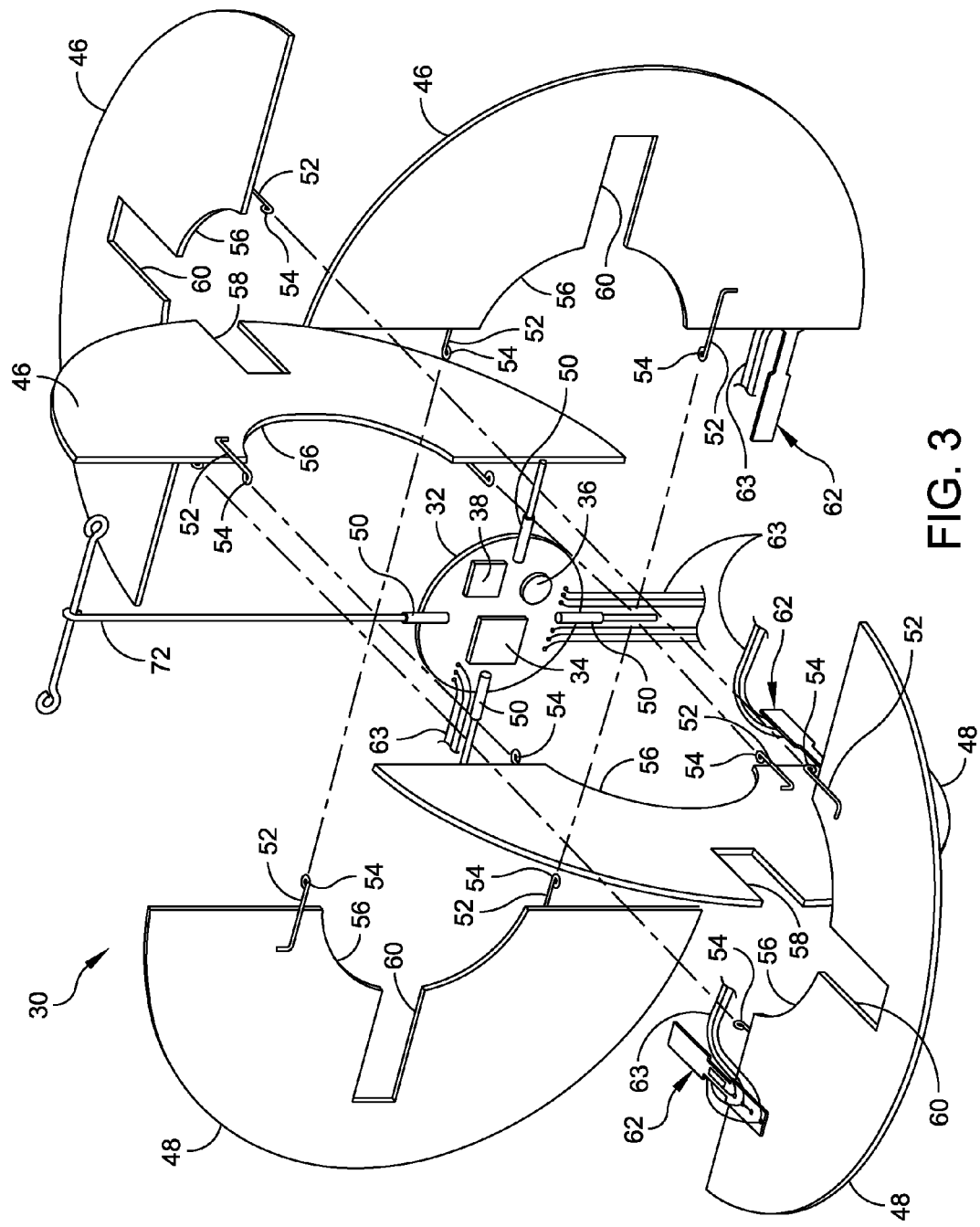
FIG. 3 is an exploded perspective view of the airflow detecting device shown in FIG. 2.

Referring now to FIGS. 2 and 3, in one embodiment the airflow detecting device 30 is particularly configured to detect airflow from any direction and to measure airflow that is relatively small, such as 0.5 mph. As shown, the airflow detecting device 30 includes a control module 32 that is located at a center of the airflow detecting device. In one embodiment, the control module 32 embodies a printed circuit board assembly having components mounted on the printed circuit board. For example, the control module 32 may include a microprocessor 34, a battery 36 and a radio transceiver 38. The radio transceiver 38 is configured to communicate with and send airflow data from the airflow detecting device 30 to the controller 22, which in turn may be configured to manipulate the cooling units 16 and fans 18 to address the cooling demands of the data center 10. As will be shown below, the control module 32 is configured to determine the direction and the amount of airflow based on information provided by other components of the airflow detecting device.

The airflow detecting device 30 further includes first, second and third vane assemblies generally, indicated at 40, 42 and 44, respectively. The first vane assembly 40 is coupled to the control module 32 and configured to detect airflow along an x-axis, for example. Similarly, the second vane assembly 42 and the third vane assembly 44 are coupled to the control module 32 and configured to detect airflow along a y-axis and a z-axis, respectively. As shown, each vane assembly 40, 42 and 44 includes a first vane portion 46 and a separate second vane portion 48. Each vane portion 46, 48 is configured as a semi-circle that is adapted to mate with its corresponding vane portion. In certain embodiments, the vane portion 46, 48 may be fabricated from any suitable lightweight material. For example, the vane members may be made from balsa wood, tissue paper or lighweight paper or Mylar material. The provision of lightweight material, such as balsa wood, is more important for the vane portions 46, 48 of the horizontal vane assembly 44 to counter the force of gravity effecting the vane portions.

The vane assemblies 40, 42 and 44 further include a plurality of pivot rods, each indicated at 50, which are secured to the control module 32 so that they extend radially from the control module. Specifically, two pivot rods 50 are configured to extend along the z-axis. Two additional pivot rods 50 are configured to extend along the y-axis. It should be understood that although four pivot rods 50 are provided in the embodiment shown in FIGS. 1 and 2, any number of pivot rods may be provided. For example, one pivot rod may be provided so that the pivot rod extends through the control module for the z-axis connection and another pivot rod may be provided so that it extends through the control module for the y-axis connection. To connect the vane portions 46, 48 to the pivot rods 50, each vane portion has two wires, each indicated at 52, each wire having a first end secured to the vane portion and a second end configured with an eyelet 54 that is sized to receive the pivot rod 50 therein.

The arrangement is such that the vane portions 46, 48 of the first vane assembly 40 and the second vane assembly 42 are connected to pivot rods 50 that extend along the z-axis by the wires 52 associated with the vane portions. The result is that the first vane assembly 40 lies along a vertical plane extending along the x-axis and the second vane assembly 42 lies along a vertical plane extending along the y-axis. The first vane assembly 40 lies along a vertical plane that is perpendicular to the vertical plane of the second vane assembly 42. The vane portions 46, 48 of the third vane assembly 44 are connected to the pivot rods 50 that extend along the y-axis by the wires 52 associated with the vane portions 46, 48. The result is that the third vane assembly 44 lies along a horizontal plane extending along the x-axis.

Each vane portion 44, 46 of the first vane assembly 40 includes a semi-circular cutout 56 along the straight edge of the vane portion and a slot 58 along the outer edge of the vane portion. Each vane portion 46, 48 of the second and third vane assemblies 42, 44 includes a semi-circular cutout 56 that transitions to a slot 60 formed in the body of the vane portion. These slots 58, 60 are provided to enable the vane portions 46, 48 to be configured in the manner illustrated in FIG. 1. Specifically, the cutouts 56 are provided to accommodate the positioning of the control module 32 at the center of the airflow detecting device 30. The slots 58, 60 are provided so that the vane portions 44, 46 of the first, second and third assemblies 40, 42 and 44 do not interfere with one another when assembled.

Thus, it should be observed that the airflow detecting device 30 illustrated in FIGS. 2 and 3 is particularly suited for detecting airflow in any direction. Airflow directed along the x-axis is received by the second vane assembly 42. Airflow directed along the y-axis is received by the first vane assembly 40. And finally, airflow directed along the z-axis is received by the third vane assembly 44. Airflow directed in more than one direction is received by two or three vane assemblies 40, 42 and 44.

The first, second and third vane assemblies each include a sensor assembly 62 that is connected to the control module 32. Fine wires, each indicated at 63, are provided to connect the sensor assembly 62 to the control module 32. Specifically, the wires 63 are configured to run along the pivot rods to the control module 32. Although one sensor assembly 62 is shown for each vane assembly 40, 42 and 44, it should be noted that more than one sensor assembly may be provided to detect the movement of the vane portion 46 with respect to the other vane portion 48. Each sensor assembly 62 is capable of generating a signal when its respective vane assembly 40, 42 and 44 is deformed by airflow, specifically the movement of the vane portions 44, 46 with respect to one another. Each sensor assembly 62 includes a host strip 64 that is secured to the first vane portion 46 and the second vane portion 48 and a strain gauge 66 that is coupled to the host strip and the control module 32. Reference may be made to FIGS. 4 and 5, which illustrate the connection of the strain gauge 66 to the host strip 64. The host strip 64 has a body having enlarged end portions 68 and a narrow middle portion 70, with the strain gauge 66 being secured to the body at the narrow portion 70. As shown in FIG. 4, a second strain gauge 66 may be secured to the host strip 64 on an opposite side of the host strip.

When airflow engages the vane assemblies 40, 42 and 44, the vane portions 46, 48 of the effected vane assembly deflect with respect to one another by virtue of their hinged connection with the pivot rods 50. This results in the strain gauge 66 of the sensor assembly 62 deflecting and generating a signal that is sent to the control module 32. Based on the amount of deflection, the magnitude of the airflow may be determined by the microprocessor 34 of the control module 32. Also, based on the effected vane assemblies, the direction of the airflow may be determined as well. The airflow impacts both vane portions 46, 48 of the effected vane assemblies 40, 42 and 44, with the two semi-circular vane portions pivoting about a central pivot point defined by the pivot rods 50. Generally speaking, airflow exerts approximately equal force on both vane portions 46, 48, which results in the bending of the strain gauge 66 of the sensor assembly 62. The total bending force on the host strip 64 is double what it would be with a single vane portion anchored to the device. The configuration of the sensor assembly 62 enables the force to be concentrated on the strain gauge 66. In certain embodiments, as shown in FIG. 4, two strain gauges 66 may be provided on the host strip 64. This embodiment would double the sensitivity of the sensor assembly 62.

The airflow detecting device 30 illustrated in FIGS. 2 and 3 may further include a hanging post 72, which is connected to one of the pivot posts 50. As shown, the hanging post 72 includes a vertical wire suitably connected to a pivot rod 50 and a horizontal wire connected to the vertical wire. The arrangement is such that the airflow detecting device 30 may be hung or otherwise supported in any suitable location within the data center by the hanging post 72.

In one embodiment, the strain gauge 66 may be of the type manufactured by Omega Engineering, Inc. of Stamford, Conn., United States under manufacturer part no. SGD-31350-LY13. The nature of the strain and magnitude may be read to determine both the rate of airflow. The strain gauge 66 produces a change in resistance proportional to the strain exerted upon it. The varied resistance applied across one side of a bridge circuit of the strain gauge 66 produces a voltage variation proportional to the resistance change of the strain gauge. This voltage signal may be used as the input to an analog differential amplifier that provides a certain gain to provide signal amplitude suited for measurement by an analog-to-digital converter ("A/D converter"). The A/D converter is in communication with the controller 22 that applies the necessary operation to provide a numeric value in suitable units (such as miles per hour or meters per second). This value is then used in combination with other values known to the controller 22 to regulate the fans 18 of the cooling units 16 as needed to maintain the proper proportion of cooler airflow to IT airflow.

Figure 6:
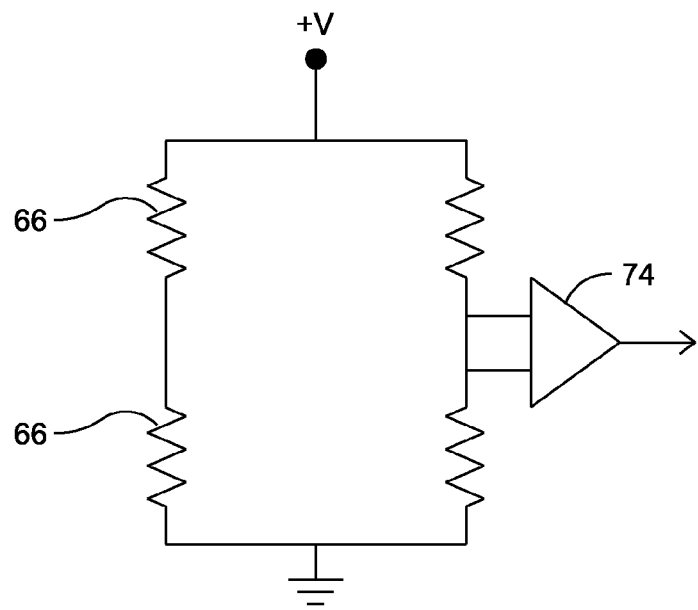
FIG. 6 is a schematic view of a bridge circuit used in a sensor assembly of embodiments of the disclosure.
Figure 9:
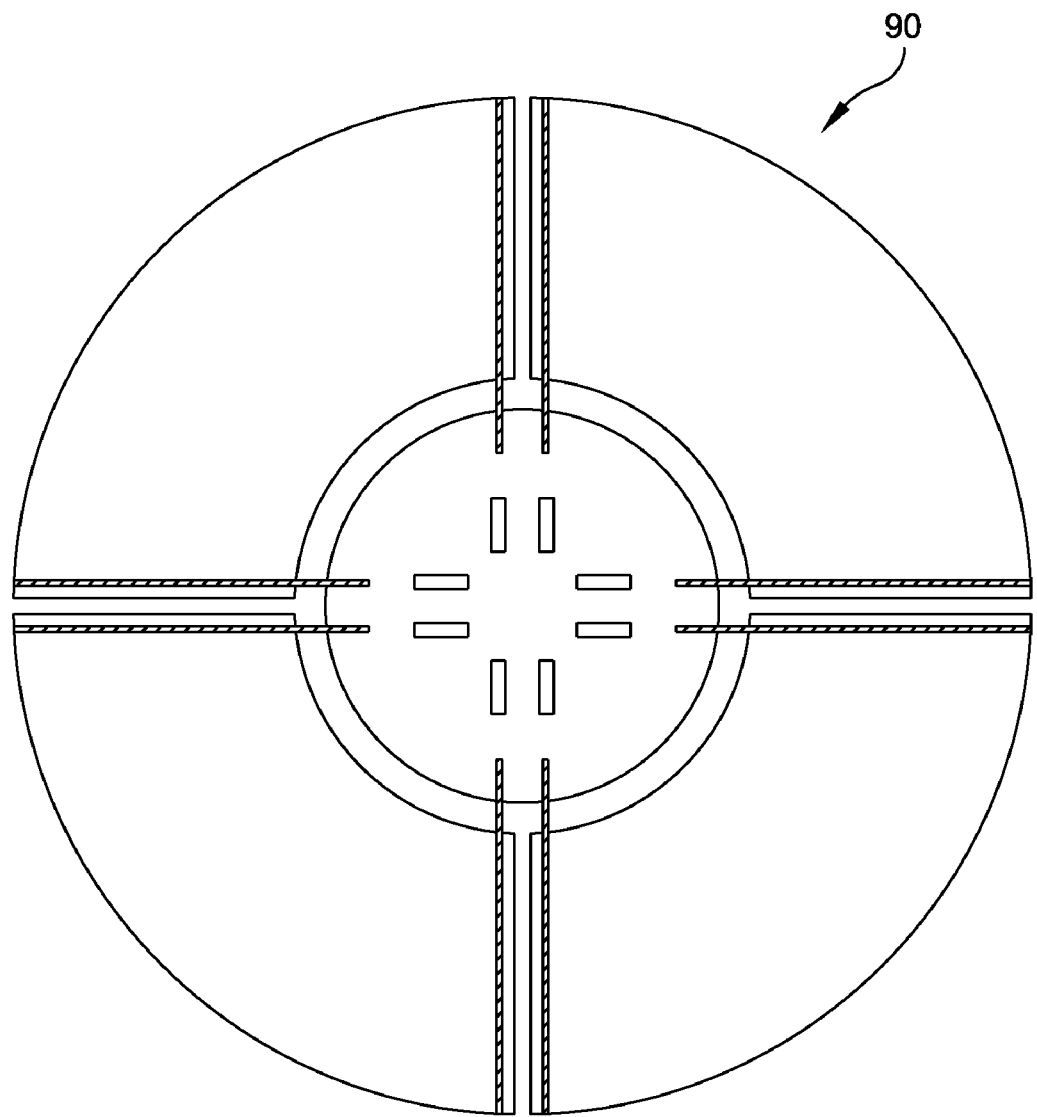
FIG. 9 is a schematic cross-sectional view of an airflow detecting device of another embodiment of the disclosure.

In certain embodiments, and with reference to FIG. 6, the two strain gauges 66 of the sensor assembly 62 are wired in a bridge so that mechanical tension and compression forces on the strain gauges cancel out. Also, this configuration cancels stresses due to thermal expansion and other thermal effects. As shown in FIG. 9, a differential amplifier 74 provides high electrical gain feeding into an analog-to-digital converter. It has been observed that airflow rates as low as 0.1 m/s resulted in approximately twenty counts of change on the analog-to-digital converter.

Figure 7:
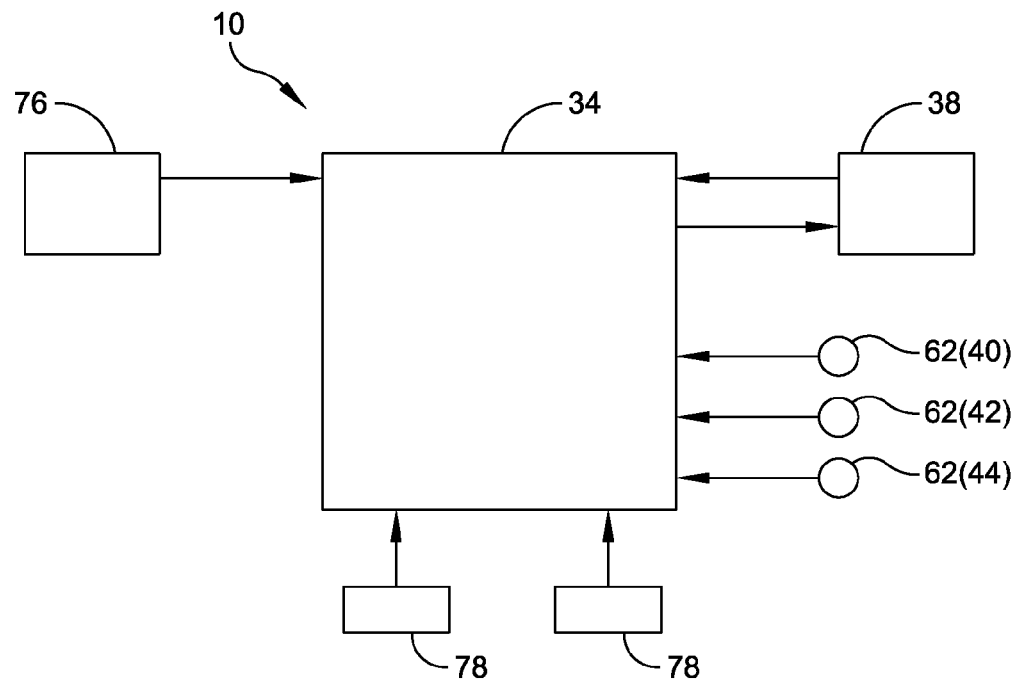
FIG. 7 is a block diagram of an airflow detecting device of an embodiment of the disclosure.

FIG. 7 illustrates a block diagram of the airflow detecting device 10. As shown, the microprocessor 34 is coupled to the transceiver 38 and the sensor assemblies 62 of the vane assemblies 40, 42 and 44. The battery 36 is configured to provide power to all of the components of the control module 32. In one embodiment, the microprocessor 34 may be of the type manufactured by Atmel Corporation of San Jose, Calif., United States under model number ATmega164PV-10AU. The transceiver 38 may be an XBee-Pro-type transceiver that is available from Digi International of Minnetonka, Minn., United States. As shown, a reset 76 is provided to reset the operation of the microprocessor 34. In addition, sensors 78, such as temperature and humidity sensors, may be coupled to the microprocessor 34 to provide sensory information to the microprocessor.

Figure 8B:
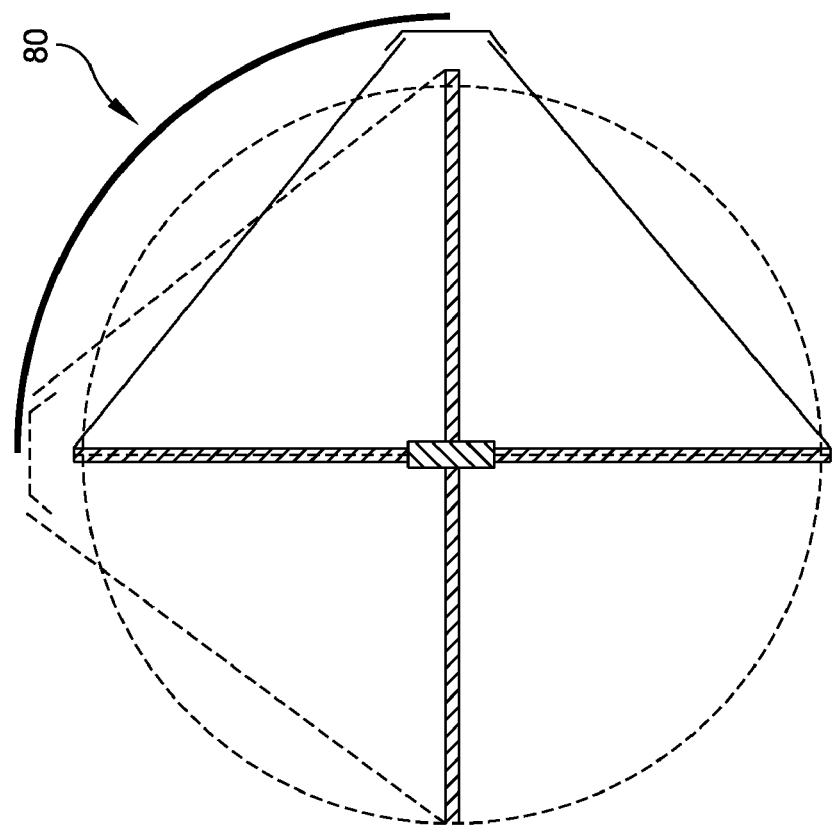
FIGS. 8A and 8B are schematic cross-sectional views of an airflow detecting device of another embodiment of the disclosure.
Figure 8A:
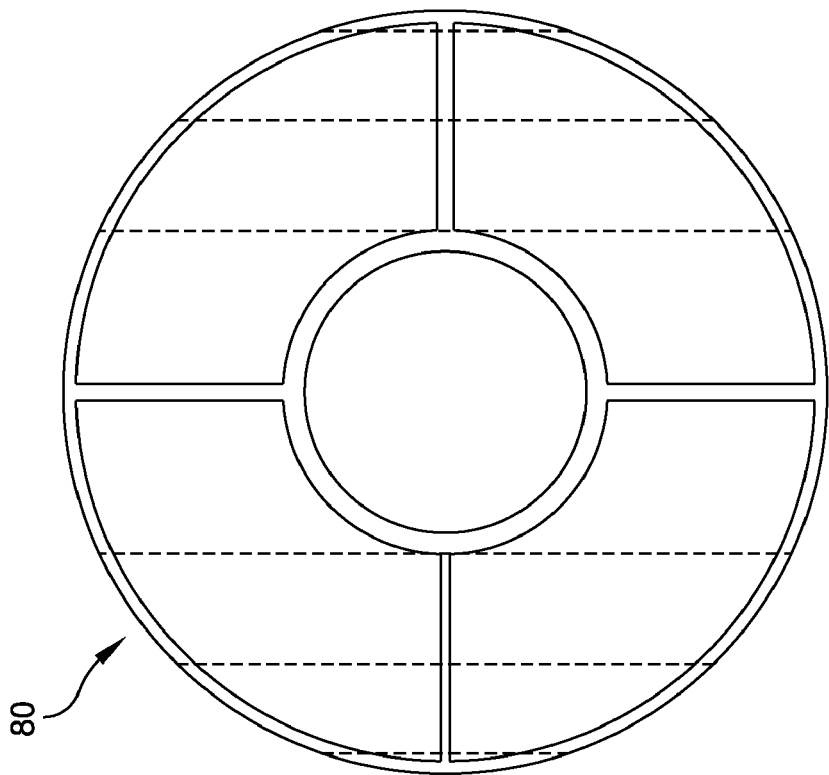

Referring now to FIGS. 8-10, embodiments of the airflow detecting device are illustrated therein. In FIGS. 8A and 8B, an airflow detecting device, generally indicated at 80, includes three co-centric disks, one for each axis, which are interconnected to one another by strain connectors. Each disk is fabricated from an externally positioned wire forming an outline of the disk, which is attached to lightweight material forming the body of the disk. With this configuration, the control module (not shown) is positioned outside the disks of the airflow detecting device 80.

FIG. 9 illustrates an airflow detecting device of another embodiment, generally indicated at 90. The airflow detecting device 90 includes three co-centric disks similar to the arrangement shown in FIGS. 8A and 8B and a control module that is positioned at the center of the airflow detecting device.

Figure 10A:
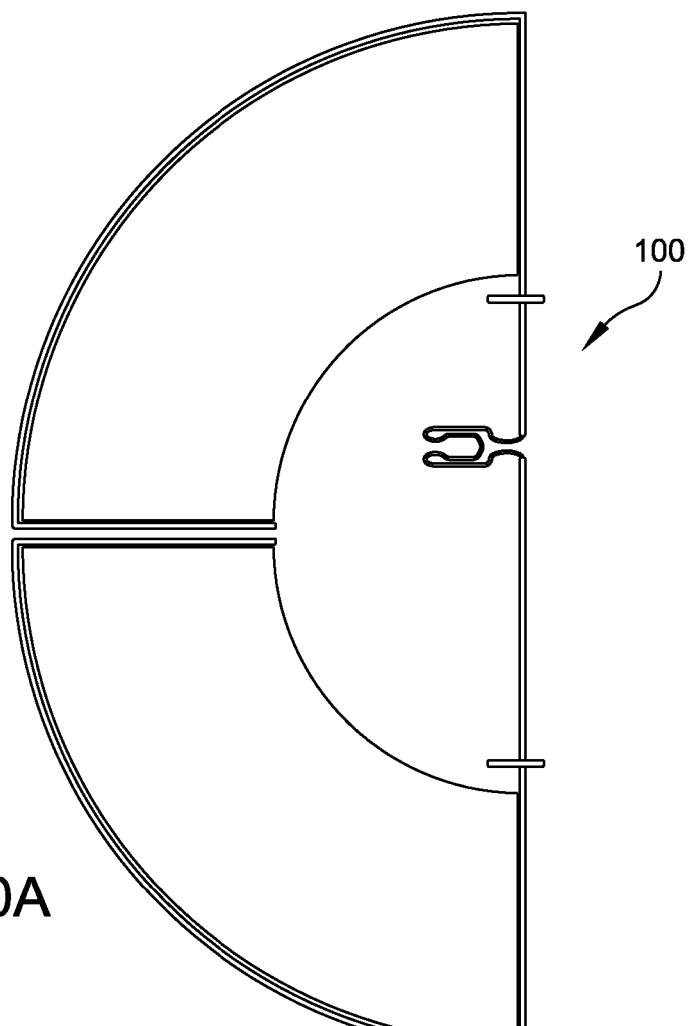
FIGS. 10A, 10B and 10C are schematic views of an airflow detecting device of another embodiment of the disclosure.
Figure 10B:
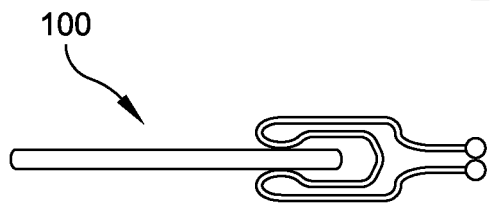
Figure 10C:
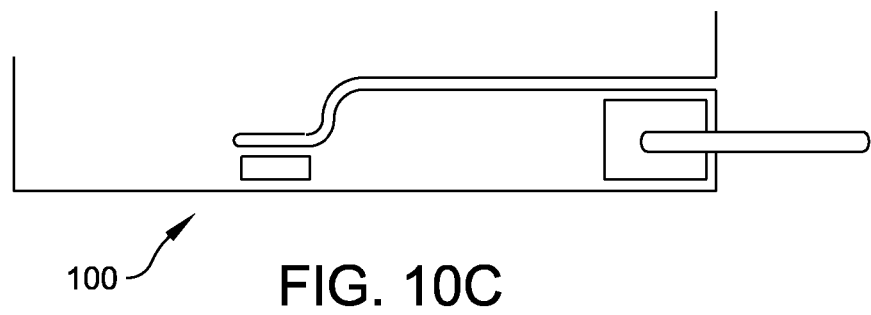

FIGS. 10A, 10B and 10C are directed to an airflow detecting device of yet another embodiment, generally indicated at 100. With this embodiment, the airflow detecting device 100 includes vane portions having sensors integrally formed with the material of the vane portions. Specifically, each vane portion includes a wire forming an exterior of the vane portion, which is attached to a body of the vane portion. The sensor is integrally formed by the wire of the vane portion in the manner shown in FIGS. 10A, 10B and 10C.

Embodiments of the disclosure may further include a method for detecting airflow within an air containment zone. In one particular embodiment, the method may include providing an airflow detecting device, such as device 30, at a boundary of the air containment zone, and measuring a parameter of airflow within the air containment zone with the airflow detecting device. The airflow detecting device may be employed adjacent an opening in a panel of the air containment zone or in any other suitable location, e.g., in an equipment rack or a cooling unit, provided the airflow detecting device is located along a boundary of the air containment zone. The measured parameter may be strain applied to one or more sensor assemblies 62 of the airflow detecting device 30. In addition, or in the alternative, the measured parameter may be a direction of airflow. In a certain embodiment, the airflow detecting device may be any of the devices described above or embodiments described below. The method may further include controlling a flow of air out of the air containment zone based on the measured parameter. This may be achieved by operating a fan of a cooling unit that is in fluid communication with the air containment zone in response to information obtained by the airflow detecting device.

Referring back to FIG. 1, a plurality of both equipment racks and cooling units may be placed in such a manner as to substantially form an air containment zone between two parallel rows of equipment. This air containment zone may be further enhanced with the inclusion of ceiling panels (not shown) spanning across the hot aisle. The ceiling panels may be supported by the rows of equipment racks and cooling units at the sides of the aisle and by either a pair of equipment racks or a pair of cooling units, or some combination of equipment racks and cooling units, at the ends of the aisle. Additionally, the integrity of the air containment zone may by further enhanced by the inclusion of one or more door/panel systems placed at each end. Such a system serves to provide a substantial physical barrier between the air containment zone, i.e., the hot aisle, and the larger exterior ambient space.

As shown by arrows in FIG. 1, each equipment rack draws relatively cool air from the larger ambient space and discharges warm air into the air containment zone. The airflow rate of any given equipment rack is highly dependent upon IT work load and ambient temperature, and typically varies substantially over time. The combined net airflow of all IT equipment into the hot air containment zone becomes highly variable and difficult to predict. It is desired to have the cooling unit(s) extract the combined net IT airflow into the air containment zone plus some of a slight additional quantity to assure that any air leakage is cool air into the hot containment zone instead of outward flow of un-cooled hot air. Typically, airflow provided by the cooling units would be on the order of magnitude of 110% of the net heated IT airflow. Thus, the air containment zone is at slight negative pressure as compared to the surrounding ambient space. Airflow rates by the cooling units substantially greater than this value serve no benefit to the cooling functionality and result in excessive fan power consumption. Thus, it is most economical to operate the cooling units to remove and cool air from the air containment zone at a rate slightly greater than the rate of hot air entering the air containment zone from the equipment racks.

A calibrated leak may be created in such a manner as to penetrate through one of the physical boundaries. For example, a device, such as one of the airflow detecting devices described herein, may be provided in a panel forming the physical barrier. The device may consist of one or more vane assembly having vane portions that are hingedly connected to one another. A strain gauge may be coupled with the vane portions to detect strain imposed by movement of air effecting the vane portions. In addition, multiple vane assemblies may be provided to detect a direction the air is flowing. The magnitude of airflow may also be evaluated by measuring the magnitude of strain across the hinge. This data may be sent to the controller associated with either the equipment rack or the cooling unit or both. The controller may be configured to control the operation of the fan of one of the cooling units or fans of multiple cooling units. The controller may adjust a fan speed based upon a control algorithm to maintain the desired direction and magnitude of leakage between the contained zone and exterior ambient space.

Thus, it should be observed that the airflow detecting devices disclosed herein may be configured in any suitable manner to detect the direction and magnitude of airflow through the equipment rack. It is desirable to closely match the airflow of cooling equipment to that of IT equipment housed within equipment racks. Matching the airflow of cooling equipment to the IT equipment requirement is difficult since the IT equipment may not operate at a constant or known temperature and the measurement of static pressure within containment zones may be extremely difficult to obtain. The provision of the airflow detecting devices disclosed herein offers an elegant solution to obtaining the direction and magnitude of airflow into and out of the containment zones defined by the equipment rack.

Although front to back airflow is primarily described herein, the airflow detecting devices of embodiments of the disclosure may be used to detect and measure side-to-side airflow within the equipment rack. In such an embodiment, the airflow detecting device would be mounted adjacent one of the sides of the equipment rack. Also, more than one air detection device may be provided in the air containment zone.

Although airflow detecting devices have been described in connection to data centers, the devices may be utilized in any large area. For example, the airflow detecting devices described herein may be employed in large lobbies, auditoriums and atriums.

Thus, it should be observed that an airflow detecting device of the embodiments disclosed herein is particularly effective in measuring three-dimensional airflow within large indoor spaces. The airflow detecting device is designed to be sensitive so that it is capable of detecting slow-moving air. In addition, the device is lightweight and relatively small (approximately 4.5 inches in diameter). Given the relatively simple construction with few parts, the airflow detecting device may be fabricated at a reasonably low cost, thereby permitting dozens of the devices to be suspended in large open spaces.

The airflow detecting device may be positioned within a large space to gather three-dimensional airflow information to improve energy efficiency of the building in which the device is placed. One or more airflow detecting devices may be positioned in areas other than data centers, such as large lobbies, auditoriums, and atriums. In areas having exterior glass walls, airflow detecting devices may be used to map airflow within the space defined by the glass wall.

An airflow detecting device of embodiments of the disclosure is configured to detect airflow as slow-moving as 0.5 mph, and even as low as 0.15 mph, with resolutions as low as 0.07 mph. The airflow detecting device requires very little power to operate and is therefore capable of operating with use of small batteries. In embodiments, the device is capable of operating for greater than one year while using a relatively small battery, such as a AA cell. The battery should be sufficiently sized to power the operation of the sensor and the control module (microprocessor and radio transceiver). The device may be configured to transition from an operating mode in which the device gathers airflow data to a sleep mode.

In certain embodiments, an airflow detecting device may be configured to have one or more low powered lights to indicate the operation of the device.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The disclosure's limit is defined only in the following claims and equivalents thereto.

What is claimed is:

1. An airflow detecting device comprising:
    at least one pivot rod;
    a first vane portion hingedly secured to and extending along a length of the at least one pivot rod;
    a second vane portion hingedly secured to and extending along a length of the at least one pivot rod, the arrangement being that the first vane portion is hingedly secured on one side of the at least one pivot rod and the second vane portion is hingedly secured to an opposite side of the at least one pivot rod so that the first vane portion and the second vane portion generally lie along a common plane;
    a first sensor assembly connected to the first vane portion and the second vane portion, the first sensor assembly generating a signal when the one of the first vane portion and the second vane portion is moved relative to the other of the second vane portion and the first vane portion when effected by airflow; and
    a control module secured to the at least one pivot rod and coupled to the first sensor assembly to receive the signal from the first sensor assembly, the control module being configured to determine the direction and the amount of airflow based on the signal from the first sensor assembly.

2. The device of claim 1, wherein the first sensor assembly includes a host strip secured to the first vane portion and the second vane portion and at least one strain gauge coupled to the host strip and the control module.

3. The device of claim 2, wherein the host strip has a body having enlarged end portions and a narrow middle portion, the at least one strain gauge being secured to the body at the narrow portion.

4. The device of claim 1, wherein the control module includes a microprocessor, a battery and a radio transceiver.

5. The device of claim 1, wherein the first vane portion and the second vane portion each includes a wire having a first end secured to the vane portion and a second end configured with an eyelet sized to receive the at least one pivot rod therein.

6. The device of claim 1, further comprising
    a third vane portion hingedly secured to and extending along a length of the at least one pivot rod, a fourth vane portion hingedly secured to and extending along a length of the at least one pivot rod, the arrangement being that the third vane portion is hingedly secured on one side of the at least one pivot rod and the fourth vane portion is hingedly secured to an opposite side of the at least one pivot rod so that the third vane portion and the fourth vane portion generally lie along a common plane that is generally perpendicular to the plane of the first vane portion and the second vane portion, and a second sensor assembly connected to the third vane portion and the fourth vane portion, the second sensor assembly generating a signal when the one of the third vane portion and the fourth vane portion is moved relative to the other of the fourth vane portion and the third vane portion when effected by airflow.

7. The device of claim 6, wherein the third vane portion and the fourth vane portion each includes a wire having a first end secured to the vane portion and a second end configured with an eyelet sized to receive the at least one pivot rod therein.

8. The device of claim 6, further comprising
a fifth vane portion hingedly secured to and extending along a length of the at least one pivot rod,
a sixth vane portion hingedly secured to and extending along a length of the at least one pivot rod, the arrangement being that the fifth vane portion is hingedly secured on one side of the at least one pivot rod and the sixth vane portion is hingedly secured to an opposite side of the at least one pivot rod so that the fifth vane portion and the sixth vane portion generally lie along a common plane that is generally perpendicular to the planes of the first and second vane portions and the third and fourth vane portions, and
a third sensor assembly connected to the fifth vane portion and the sixth vane portion, the third sensor assembly generating a signal when the one of the fifth vane portion and the sixth vane portion is moved relative to the other of the fifth vane portion and the sixth vane portion when effected by airflow.

9. The device of claim 8, wherein the fifth vane portion and the sixth vane portion each includes a wire having a first end secured to the vane portion and a second end configured with an eyelet sized to receive the at least one pivot rod therein.

10. The device of claim 1, wherein the first vane portion and the second vane portion are each fabricated from lightweight material including balsa wood.

11. An airflow detecting device comprising:
a control module;
a first vane assembly coupled to the control module and configured to detect airflow along an x-axis;
a second vane assembly coupled to the control module and configured to detect airflow along a y-axis; and
a third vane assembly coupled to the control module and configured to detect airflow along a z-axis,
wherein each of the first, second and third vane assemblies include a sensor coupled to the control module, each sensor being configured to generate a signal when its respective vane assembly is deformed by airflow,
wherein the control module is configured to determine the direction and the amount of airflow based on signals generated by the sensors of the vane assemblies, and
wherein each vane assembly includes at least one pivot rod, a first vane portion hingedly secured to and extending along a length of the at least one pivot rod, and a second vane portion hingedly secured to and extending along a length of the at least one pivot rod, the arrangement being that the first vane portion is hingedly secured on one side of the at least one pivot rod and the second vane portion is hingedly secured to an opposite side of the at least one pivot rod so that the first vane portion and the second vane portion generally lie along a common plane.

12. The device of claim 11, wherein the first vane portion and the second vane portion each includes a wire having a first end secured to the vane portion and a second end configured with an eyelet sized to receive the at least one pivot rod therein.

13. The device of claim 11, wherein the at least one sensor includes a host strip secured to the first vane portion and the second vane portion and at least one strain gauge coupled to the host strip and the control module.

14. The device of claim 13, wherein the host strip has a body having enlarged end portions and a narrow middle portion, the at least one strain gauge being secured to the body at the narrow portion.

15. The device of claim 11, wherein the first vane portion and the second vane portion are each fabricated from lightweight material including balsa wood.

16. The device of claim 11, wherein the control module includes a microprocessor, a battery and a radio transceiver.

17. A method of detecting airflow within a space, the method comprising:
placing a device within the space capable of detecting a direction of airflow from at least three directions and a speed of airflow down to 0.5 mph,
wherein the device comprises
at least one pivot rod,
a first vane portion hingedly secured to and extending along a length of the at least one pivot rod,
a second vane portion hingedly secured to and extending along a length of the at least one pivot rod, the arrangement being that the first vane portion is hingedly secured on one side of the at least one pivot rod and the second vane portion is hingedly secured to an opposite side of the at least one pivot rod so that the first vane portion and the second vane portion generally lie along a common plane,
a first sensor assembly connected to the first vane portion and the second vane portion, the first sensor assembly generating a signal when the one of the first vane portion and the second vane portion is moved relative to the other of the second vane portion and the first vane portion when effected by airflow, and
a control module secured to the at least one pivot rod and coupled to the first sensor assembly to receive the signal from the first sensor assembly, the control module being configured to determine the direction and the amount of airflow.

* * * * *